US006207504B1

(12) United States Patent
Hsieh et al.

(10) Patent No.: US 6,207,504 B1
(45) Date of Patent: Mar. 27, 2001

(54) METHOD OF FABRICATING FLASH ERASABLE PROGRAMMABLE READ ONLY MEMORY

(75) Inventors: Alex Hsieh, Tainan Hsien; Chun-Ming Wu, Taipei Hsien; Chih-Hung Lin, Hsinchu, all of (TW)

(73) Assignee: United Semiconductor Corp., Hsinchu (TW)

( * ) Notice: Subject to any disclaimer, the term of this patent is extended or adjusted under 35 U.S.C. 154(b) by 0 days.

(21) Appl. No.: 09/223,337

(22) Filed: Dec. 30, 1998

(30) Foreign Application Priority Data

Jul. 29, 1998 (TW) .................................... 87112424

(51) Int. Cl.$^7$ .................................. H01L 21/336

(52) U.S. Cl. ........................... 438/264; 438/257; 438/269

(58) Field of Search ...................... 438/264, 241, 438/258, 238, 256, 267, 257, 262, 269, 320

(56) References Cited

U.S. PATENT DOCUMENTS 6,040,217 * 3/2000 Lin et al. .............................. 438/258

* cited by examiner

*Primary Examiner*—David Nelms
*Assistant Examiner*—Phuc T. Dang
(74) *Attorney, Agent, or Firm*—Jiawei Huang; J C Patents

(57) ABSTRACT

A method of fabricating flash erasable programmable read only memory. A substrate having an isolation structure is provided. A tunnel oxide layer and a floating gate layer are formed in sequence over substrate and are patterned. An ion implantation is performed and a first doped region is formed in the substrate. An oxidation step is performed to form a first oxide layer over the substrate. A nitride/oxide layer and a control gate layer are formed in sequence over the substrate. The control gate layer, the nitride/oxide layer, the first oxide layer, and the floating gate layer are patterned until the substrate is exposed. An ion implantation step is performed to form a common source region and a drain region in the substrate. Spacers are formed over the sidewalls of the control gate layer, the nitride/oxide layer, the first oxide layer, and the floating gate layer. A self-aligned silicide step is performed to form silicide layers over the control gate layer, the common source region, and the drain region.

22 Claims, 8 Drawing Sheets

(I)

(II)

(III)

(I)

(II)

(III)

(I)

(II)

(III)

(I)

(II)

(III)

(I)

(II)

(III)

(I)

(II)

(III)

METHOD OF FABRICATING FLASH ERASABLE PROGRAMMABLE READ ONLY MEMORY

CROSS-REFERENCE TO RELATED APPLICATION

This application claims the priority benefit of Taiwan application serial no. 87112424, filed July 29, 1998 the full disclosure of which is incorporated herein by reference.

BACKGROUND OF THE INVENTION

1. Field of the Invention

The present invention relates to a semiconductor fabricating method. More particularly, the present invention relates to a method of forming an erasable programmable read only memory (EEPROM).

2. Description of the Related Art

EPROM, an acronym for Erasable Programmable Read Only Memory, is the memory circuit that is most often used in computer and electronic products. One of its advantages is that neither the program, nor the data stored in the EPROM, are not lost under normal conditions. If there is a need to erase the stored program and data, it is simply exposed to an ultraviolet light source for a specified period of time. In this way, the EPROM can be reprogrammed again. However, the EPROM erase operation wipes out all the stored data residing within. Therefore, whenever a data update is required, every bit of data must be rewritten back to the EPROM, which is rather time-consuming. Technology for a flash EPROM was developed by Intel Corporation. The data does not need to be erased completely. Instead, the characteristic of the flash EPROM is to erase data block by block. Hence, the time for reprogramming a flash EPROM is reduced.

FIG. 1 is a top-view layout showing a conventional flash EPROM. In FIG. 1, the conventional flash EPROM includes an isolation structure 101, a floating gate layer 103, a control gate 105, a common source region 106, and a drain region 107.

FIGS. 2A through 2C are schematic, cross-sectional views of a portion of a semiconductor device showing the conventional steps of fabricating a flash EPROM. The (I) of each figure is a cross-sectional view of FIG. 1 taken along line I—I. The (II) of each figure is a cross-sectional view of FIG. 1 taken along line II—II. The (III) of each figure is a cross-sectional view of FIG. 1 taken along line III—III.

In FIG. 2A, a P-type substrate 100 having a shallow trench (STI) 101 therein is provided. A tunnel oxide layer 102 and a floating gate layer 103 are formed in sequence over the substrate 100, after which the tunnel oxide layer 102 and the floating gate layer 103 are patterned.

In FIG. 2B, a first isolation layer 104 and a control gate layer 105 are formed in sequence over the substrate 100. The control gate layer 105, the isolation layer 104, the floating gate layer 103, and the tunnel oxide layer 102 are patterned.

In FIG. 2C, an ion implantation step is performed to form a common source region 106 and drain regions 107 in the substrate 100. Spacers 108 are formed over the sidewalls of the control gate layer 105, the isolation layer 104, the floating gate layer 103, and the tunnel oxide layer 102. Then, a self-aligned silicide step is performed to form silicide layers 109 on the control gate layer 105, the common source region 106, and the drain region 107.

However, it is difficult to form the silicide layer 109 on an abrupt-step structure (show in FIG. 2B (II)) in the conventional process, in which the resistance of common source region 106 is increased. In FIG. 2A (II), the surface of the tunnel oxide layer 102 and the floating gate layer 103 is higher than the surface of substrate 100. Therefore the surface over the substrate 100 is not flat. In FIG. 2B (II), an abrupt-step surface 113 is formed after patterning the control gate layer 105, the isolation layer 104, the floating gate layer 103, and the tunnel oxide layer 102. In FIG. 2C (II), it is difficult to perform a self-aligned silicide step on the surface of an abrupt-step structure 114 to form the silicide layer 109 thereon. Therefore, the resistance of the common source region 106 is increased.

SUMMARY OF THE INVENTION

Accordingly, there is a need to provide an improved method of fabricating a flash EPROM in order to form silicide layers on the whole surface of the common source regions in order to reduce the resistance of the common source regions.

The invention provides a method of fabricating a flash erasable programmable read only memory. A substrate having an isolation structure is provided. A tunnel oxide layer and a floating gate layer are formed in sequence over substrate and are patterned. A first-type ion implantation is performed to form a first doped region in the substrate. An oxidation step is performed to form a first oxide layer over the substrate. A nitride/oxide layer and a control gate layer are formed in sequence over the substrate. The control gate layer, the nitride/oxide layer, the first oxide layer, the floating gate layer are patterned until the substrate is exposed. An ion implantation step is performed with the isolation structure as a mask. A common source region and a drain region are formed in the substrate. Spacers are formed over the sidewalls of the control gate layer, the nitride/oxide layer, the first oxide layer, and the floating gate layer. A self-aligned silicide step is performed to form silicide layers over the control gate layer, the common source region, and the drain region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
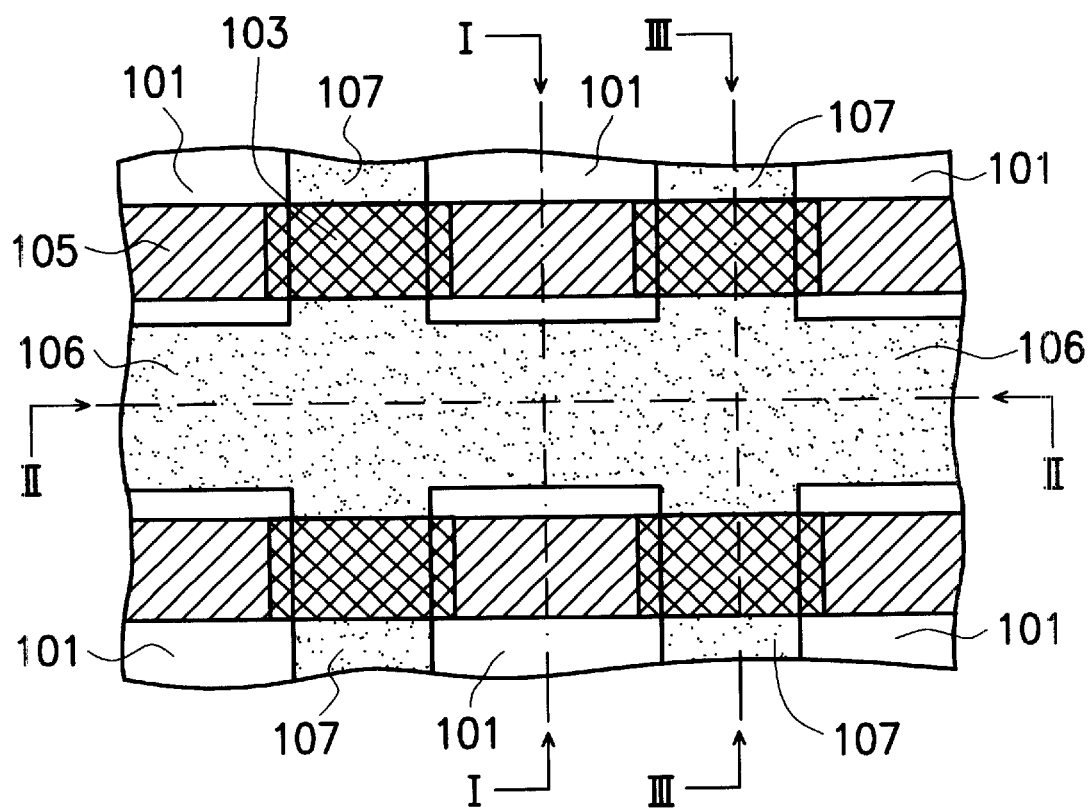
FIG. 1 is a top-view layout showing a conventional flash EPROM.
Figure 2A:
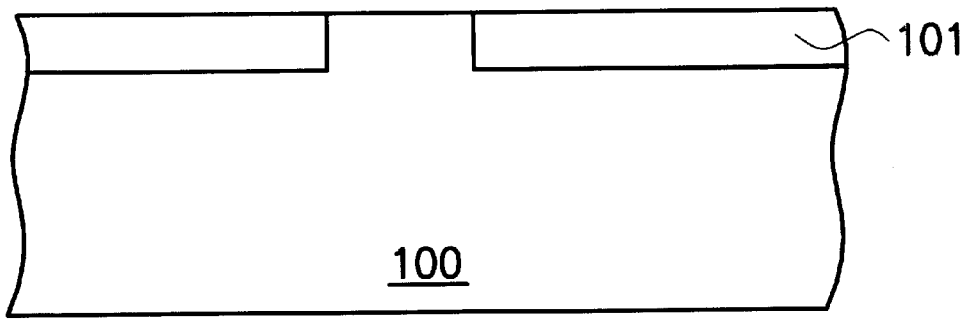
FIGS. 2A through 2C are schematic, cross-sectional views of a portion of a semiconductor device showing the conventional steps in the fabrication process for a flash EPROM. The (I) of each figure is a cross-sectional view of FIG. 1 taken along line I—I. The (II) of each figure is a cross-sectional view of FIG. 1 taken along line II—II. The (III) of each figure is a cross-sectional view of FIG. 1 taken along line III—III.
Figure 2A:
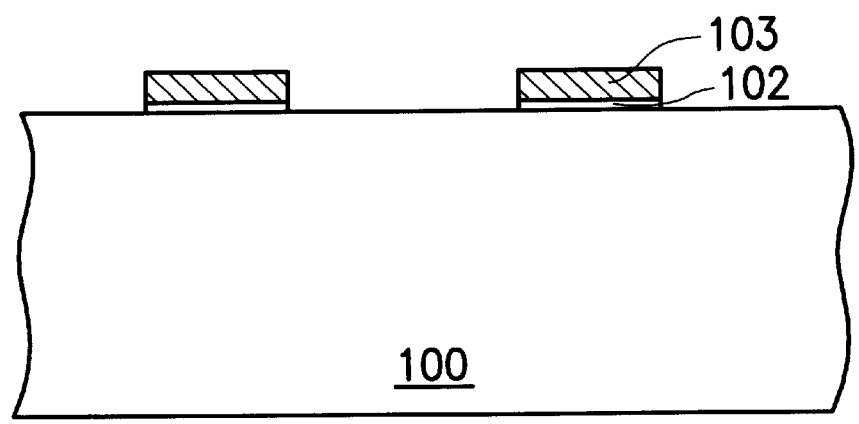
Figure 2A:
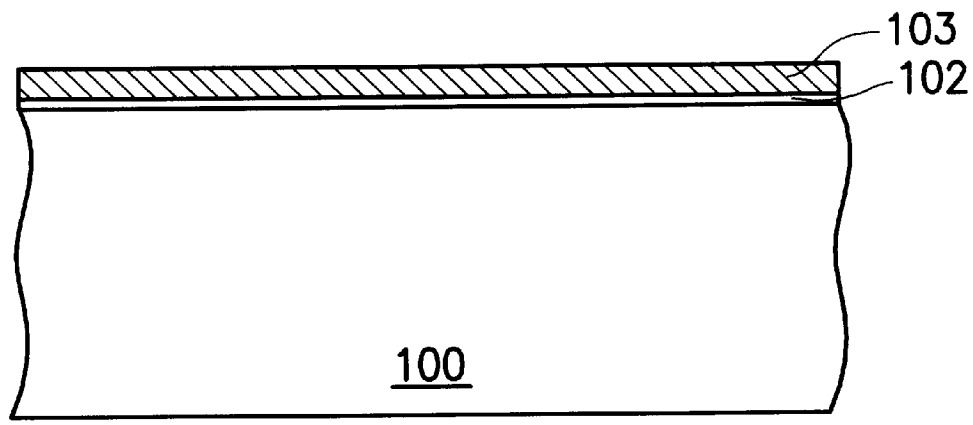
Figure 2B:
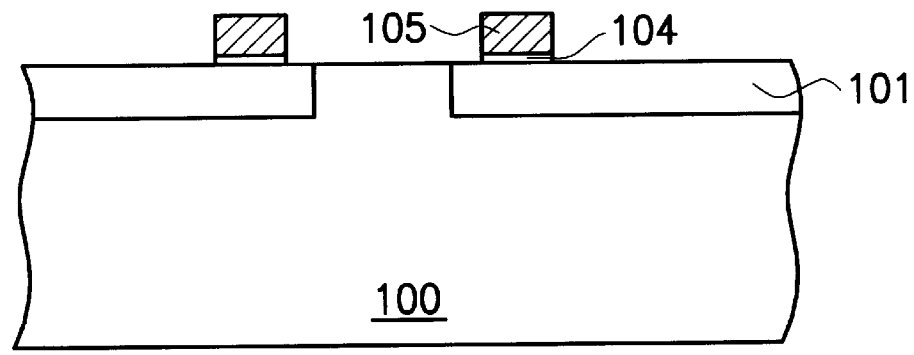
Figure 2B:
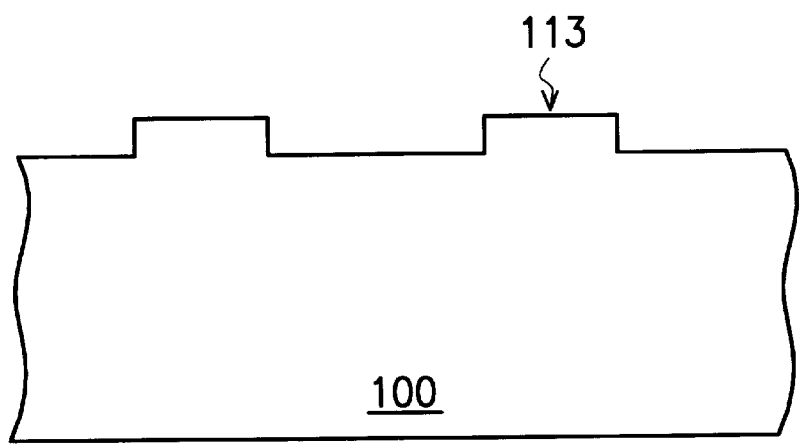
Figure 2B:
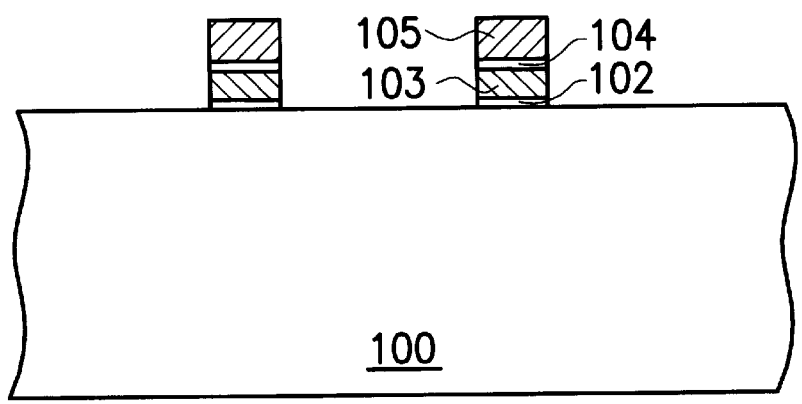
Figure 2C:
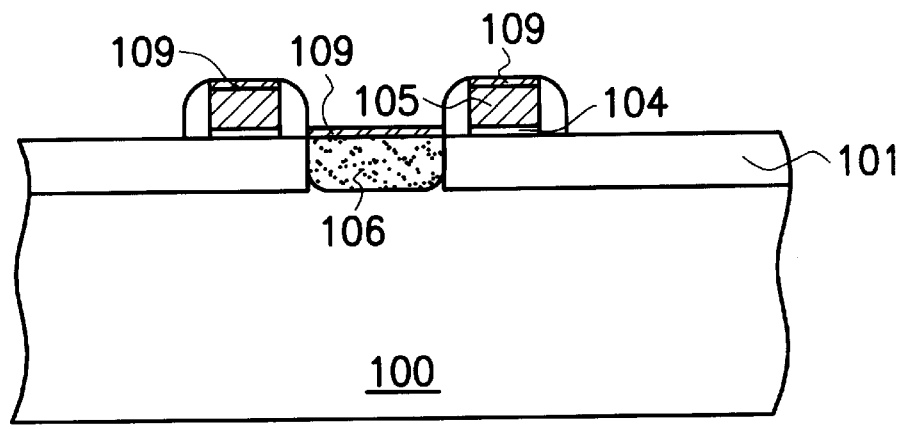
Figure 2C:
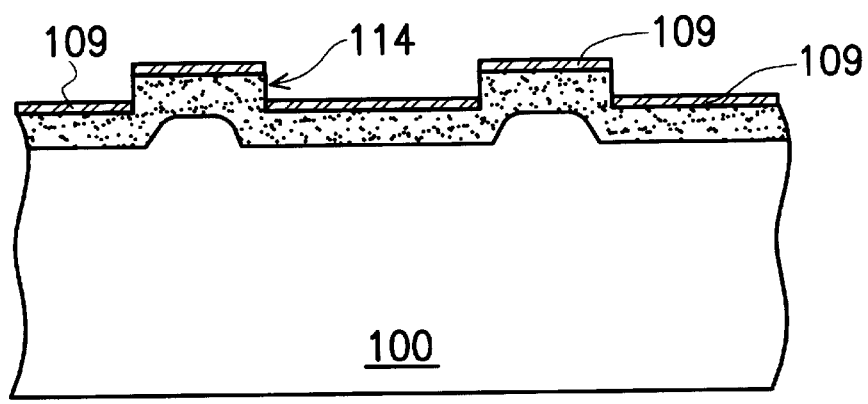
Figure 2C:
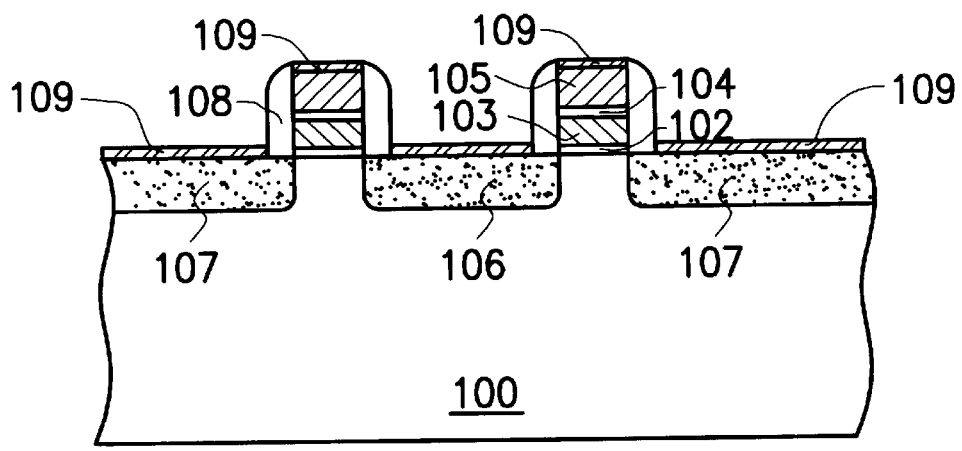

Reference will now be made in detail to the present preferred embodiments of the invention, examples of which are illustrated in the accompanying drawings. Wherever possible, the same reference numbers are used in the drawings and the description to refer to the same or like parts.

The present invention provides an improved method of fabricating a flash EPROM. A smooth surface is formed on the common source region while patterning a layer for forming a control gate. Therefore, the silicide layer can be formed all over the common source region, in which the resistance of the common source region is reduced.

FIGS. 3A through 3D are schematic, cross-sectional views of a portion of a semiconductor device showing steps in the fabrication process for a flash EPROM according to one preferred embodiment of the invention. The (I) of each figure is a cross-sectional view of FIG. 1 taken along line I—I. The (II) of each figure is a cross-sectional view of FIG. 1 taken along line II—II. The (III) of each figure is a cross-sectional view of FIG. 1 taken along line III—III.

Figure 3A:
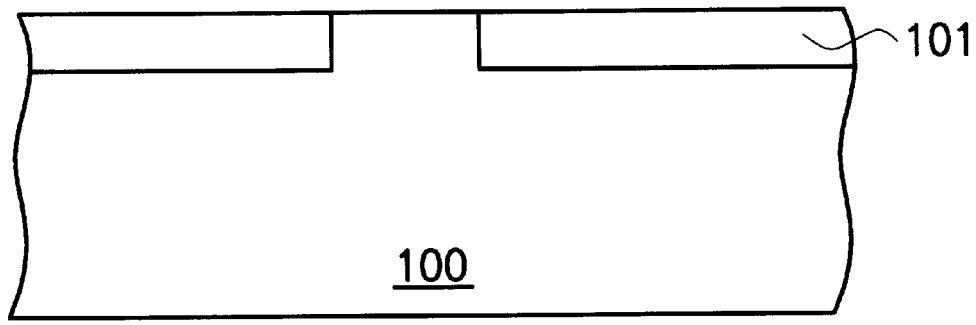
FIGS. 3A through 3D are schematic, cross-sectional views of a portion of a semiconductor device showing steps in the fabrication process for a flash EPROM according to one preferred embodiment of the invention. The (I) of each figure is a cross-sectional view of FIG. 1 taken along line I—I. The (II) of each figure is a cross-sectional view of FIG. 1 taken along line II—II. The (III) of each figure is a cross sectional-view of FIG. 1 taken along line III—III.
Figure 3A:
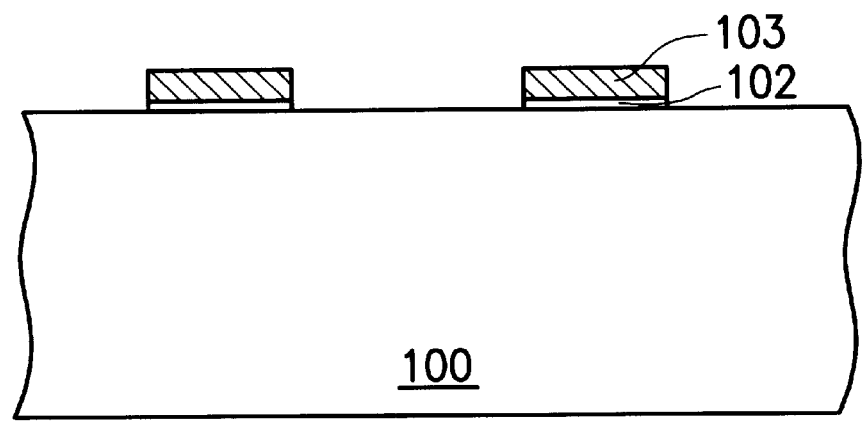
Figure 3A:
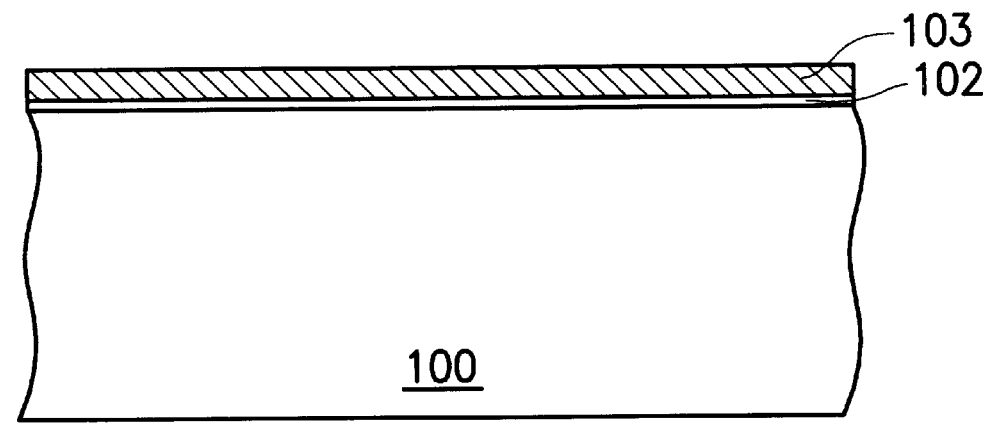

In FIG. 3A, a substrate 100 having an isolation structure 101 therein is provided. The isolation structure 101 can be a field oxide or a shallow trench isolation, for example. The substrate 100 can be a P-well, an N-well, a P-type substrate, or an N-type substrate, for example. A tunnel oxide layer 102 and a floating gate layer 103 are formed in sequence over the substrate 100. The tunnel oxide layer 102 and the floating gate layer 103 are patterned. The floating gate layer 103 can be, for example, a polysilicon layer or a doped polysilicon layer. If desired, the step of patterning the tunnel oxide layer 102 and the floating gate layer 103 can be performed by only patterning the floating gate layer 103.

Figure 3B:
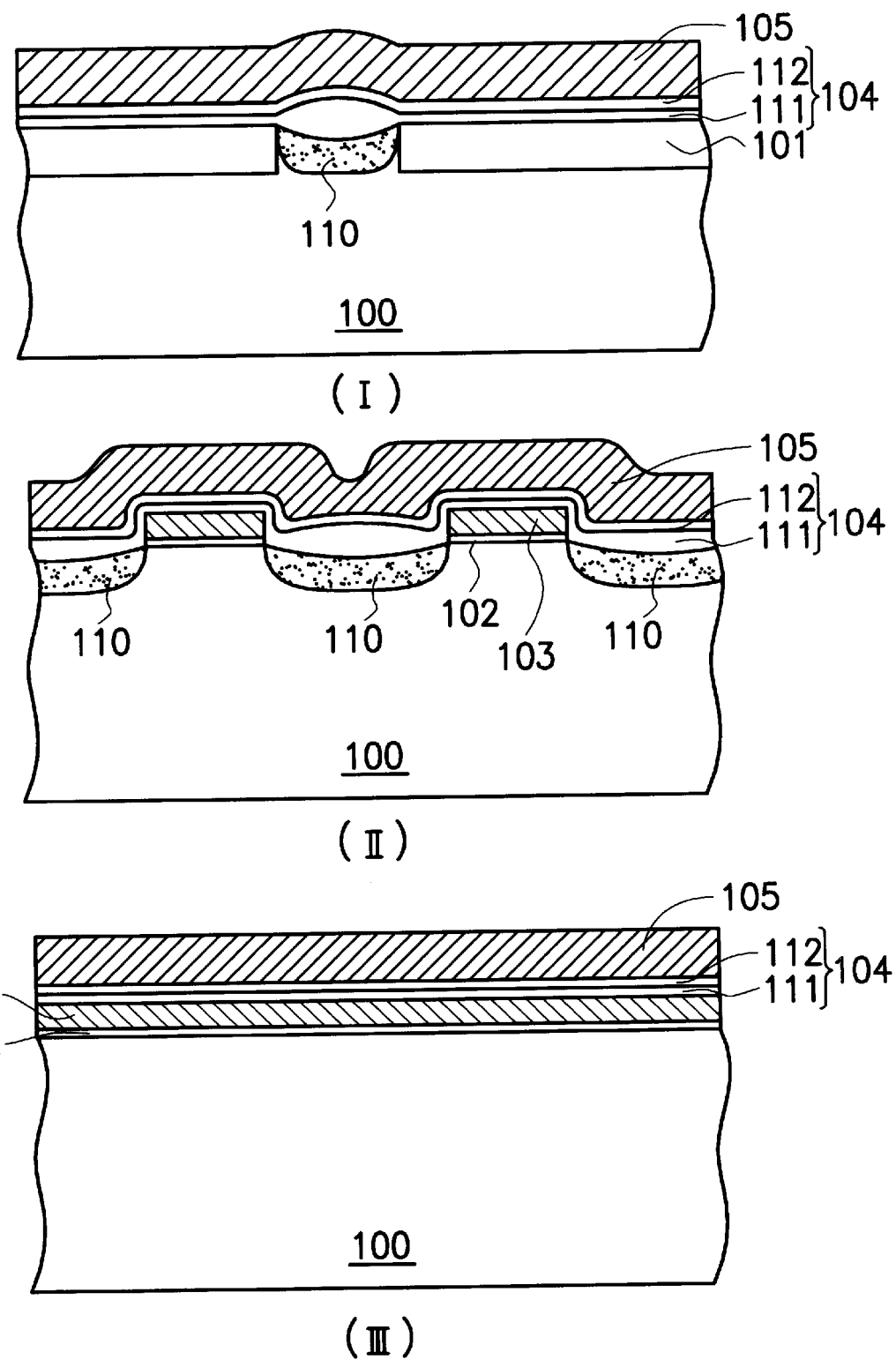

In FIG. 3B, a first-type ion implantation step is performed to form a first doped region 110 in the substrate 100. The doped region 110 can be, for example, an N$^+$ doped region while a P-type substrate 100 is provided. In contrast, the doped region 110 may be a P$^+$ doped region while an N-type substrate is provided. An oxidation step is performed to form a first oxide layer 111 over the substrate 100. Since the oxidation effect is enhanced by doping dopant into a silicon layer, the thickness of the first oxide layer 111 over the doped region 110 is thicker than the thickness of the other portions of the first oxide layer 111. A silicon nitride layer (not shown) such as a Si$_3$N$_4$ layer, is formed over the first oxide layer 111. An oxidation step is performed to form a second oxide layer (not shown). A layer that comprises the silicon nitride layer and the second oxide layer is called a nitride/oxide layer 112. A control gate layer 105, such as a polysilicon layer or a doped polysilicon layer, is formed on the nitride/oxide layer 112.

Figure 3C:
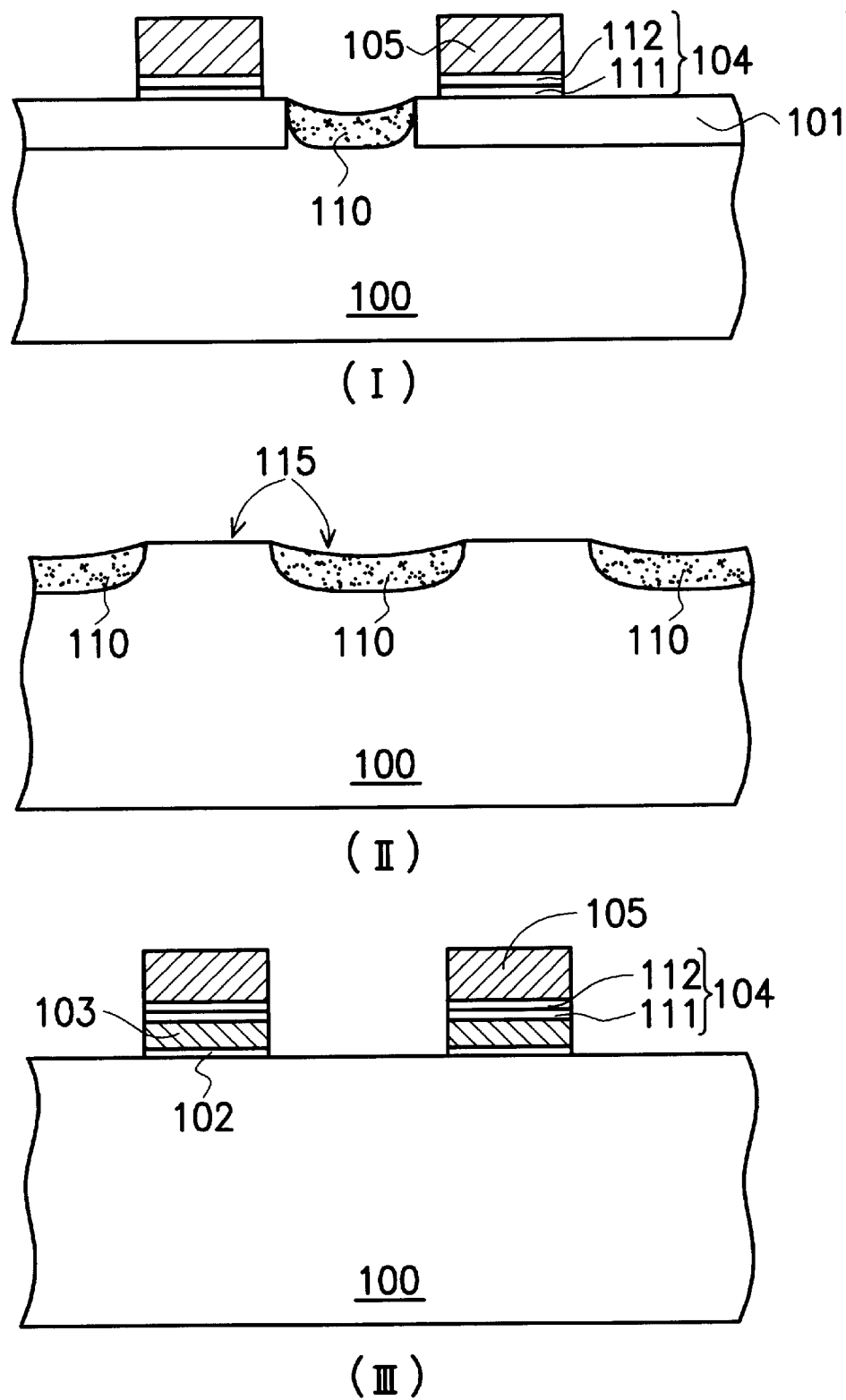

In FIG. 3C, the control gate layer 105, the nitride/oxide layer 112, the first oxide layer 111, the floating gate layer 103, and the tunnel oxide layer 102 are patterned until the substrate 100 is exposed. A smooth surface 115 over the substrate 100 is obtained. If desired, the patterning step described above can omit patterning tunnel oxide layer 102.

Figure 3D:
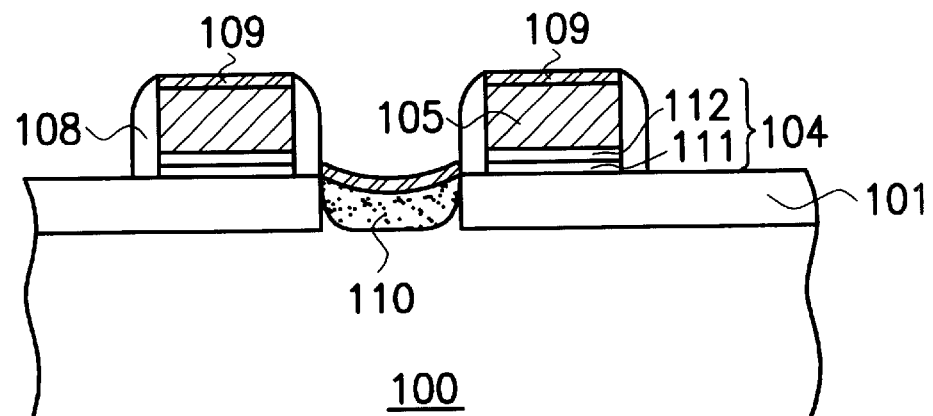
Figure 3D:
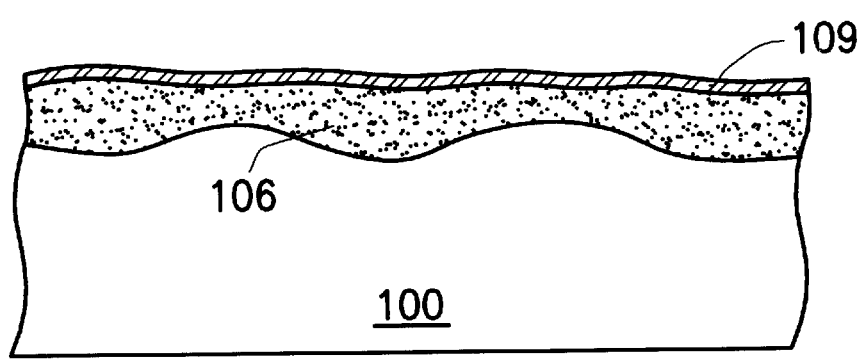
Figure 3D:
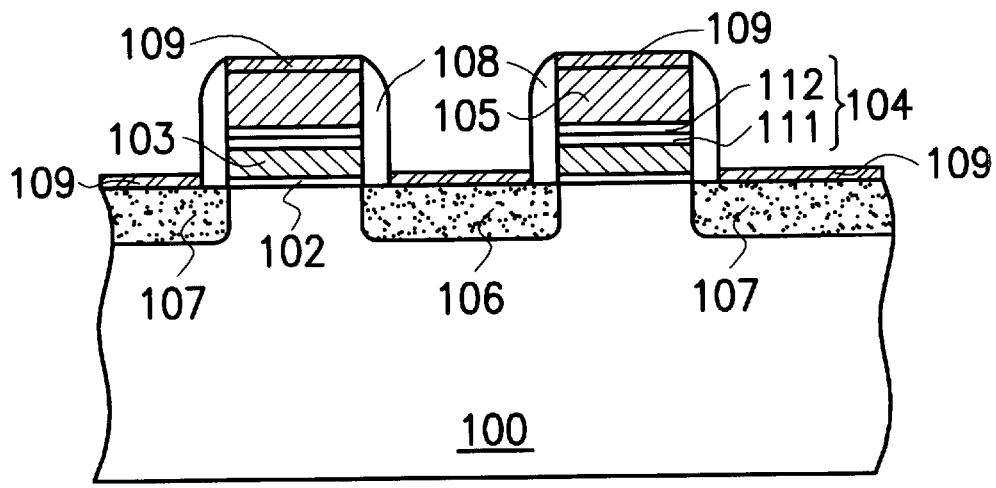

In FIG. 3D, an ion implantation step with the isolation structure 101 as a mask. A common source region 106 and drain region 107 are formed in the substrate 100. Spacers 108, such as oxide layers or silicon nitride layers, are formed on the sidewalls of the control gate layer 105, nitride/oxide layer 112, the oxide layer 111, the floating gate layer 103, and the tunnel oxide layer 102. Silicide layers 109, such as TiSi$_2$ layers or CoSi$_2$ layers, are formed on the control gate layer 105, a common source region 106, and the drain region 107 by using a self-aligned silicide step. Thus, the silicide layers 109 is formed all over the surface of the common source region 106 in order to reduce the resistance of the common source region 106.

The steps of forming the common source region 106 further include a step of forming a lightly doped source structure. The step of forming the lightly doped source structure comprises performing a lightly doped source ion implantation step to form a lightly doped source region (not shown) in the substrate. The spacers 108 are formed on the sidewalls of the control gate layer 105, the nitride/oxide layer 112, the first oxide layer 111, and the floating gate layer 103. An ion implantation step is performed to form a common source region 106 and a drain region 107 in the substrate 100.

In summary, the present invention provides a smoother surface than the surface formed by the conventional method. In addition, the present invention can form silicide all over the common source region in order to reduce the resistance of the common source region.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a flash erasable programmable read only memory, the method comprising the steps of:

providing a substrate having an isolation structure;

forming a tunnel oxide layer and a patterned floating gate layer on the substrate;

performing a first-type ion implantation step to form a first doped region in the substrate;

forming a first oxide layer over the substrate, wherein an oxidation effect is enhanced by the first doped region, and the thickness of the first oxide layer over the first doped region is greater than the thickness of the other portions of the first oxide layer;

forming a nitride/oxide layer over the first oxide layer;

forming a control gate layer over the nitride/oxide layer;

patterning the first gate layer, the nitride/oxide layer, the first oxide layer, and the floating gate layer until the substrate is exposed;

performing an ion implantation with the isolation structure as a mask;

forming spacers on sidewalls of the control gate layer, the nitride/oxide layer, the first oxide layer, the floating gate layer, and the tunnel oxide layer; and performing a self-aligned silicide step to form silicide layers over the control gate, the common source region, and the drain region.

2. The method of claim 1, wherein the tunnel oxide layer comprises a patterned tunnel oxide layer.

3. The method of claim 1, wherein the step of forming a first oxide layer comprises oxidation.

4. The method of claim 1, which further comprises patterning the tunnel oxide layer in the step of patterning the control gate layer, the nitride/oxide layer, the first oxide layer, and the floating gate layer.

5. The method of claim 1, wherein the substrate comprises a P-type substrate.

6. The method of claim 1, wherein the substrate comprises a P-well.

7. The method of claim 1, wherein the isolation structure comprises a field oxide.

8. The method of claim 1, wherein the isolation structure comprises a shallow trench isolation.

9. The method of claim 1, wherein the floating gate layer comprises a polysilicon layer.

10. The method of claim 1, wherein the floating gate layer comprises a doped polysilicon layer.

11. The method of claim 1, wherein the first doped region comprises an $N^+$-doped region.

12. The method of claim 1, wherein after the step of forming the first oxide layer, the thickness of the first oxide layer over the first doped layer is thicker than the thickness of the other portions of the first oxide layer.

13. The method of claim 1, wherein the control gate layer comprises a polysilicon layer.

14. The method of claim 1, wherein the control gate layer comprises a doped polysilicon layer.

15. The method of claim 1 wherein the spacers comprise oxide layers.

16. The method of claim 1, wherein the spacers comprise silicon nitride layers.

17. The method of claim 1, wherein the material of the silicide layers comprises $TiSi_2$.

18. The method of claim 1, wherein the material of the silicide layers comprises $CoSi_2$.

19. The method of claim 1, further comprises forming a common source region alter the ion implantation step.

20. The method of claim 1, further comprises forming a drain region after the ion implantation step.

21. A method of fabricating a flash erasable programmable read only memory, the method comprising the steps of:

providing a substrate having an isolation structure, the isolation structure comprising a shallow trench isolation;

forming a tunnel oxide layer and a patterned floating gate layer on the substrate;

performing a first-type ion implantation step to form a first doped region in the substrate;

forming a first oxide layer over the substrate;

forming a nitride/oxide layer over the first oxide layer;

forming a control gate layer over the nitride/oxide layer;

patterning the first gate layer, the nitride/oxide layer, the first oxide layer, and the floating gate layer until the substrate is exposed;

performing an ion implantation with the isolation structure as a mask;

forming spacers on sidewalls of the control gate layer, the nitride/oxide layer, the first oxide layer, the floating gate layer, and the tunnel oxide layer; and performing a self-aligned silicide step to form silicide layers over the control gate, the common source region, and the drain region.

22. A method of fabricating a flash erasable programmable read only memory, the method comprising the steps of:

providing a substrate having an isolation structure;

forming a tunnel oxide layer and a patterned floating gate layer on the substrate;

performing a first-type ion implantation step to form a first doped region in the substrate;

forming a first oxide layer over the substrate;

forming a nitride/oxide layer over the first oxide layer;

forming a control gate layer over the nitride/oxide layer;

patterning the first gate layer, the nitride/oxide layer, the first oxide layer, and the floating gate layer until the substrate is exposed;

performing an ion implantation with the isolation structure as a mask;

forming spacers on sidewalls of the control gate layer, the nitride/oxide layer, the first oxide layer, the floating gate layer, and the tunnel oxide layer; and performing a self-aligned silicide step to form silicide layers over the control gate, the common source region, and the drain region, wherein the material of the silicide layers comprises $CoSi_2$.

* * * * *